United States Patent
Kodama (10) Patent No.: US 7,250,652 B2
(45) Date of Patent: Jul. 31, 2007

(54) NONVOLATILE SEMICONDUCTOR MEMORY DEVICE INCLUDING AN ASSISTANT GATE FORMED IN A TRENCH

(75) Inventor: Noriaki Kodama, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 11/154,517

(22) Filed: Jun. 17, 2005

(65) Prior Publication Data

US 2005/0280074 A1 Dec. 22, 2005

(30) Foreign Application Priority Data

Jun. 22, 2004 (JP) ............................. 2004-183227

(51) Int. Cl.
*H01L 29/788* (2006.01)
*H01L 29/76* (2006.01)
*H01L 29/94* (2006.01)
*H01L 31/062* (2006.01)
*H01L 31/113* (2006.01)

(52) U.S. Cl. ...................... 257/316; 257/317; 257/318; 257/319; 257/320; 257/321; 257/322; 257/328; 257/329; 257/330; 257/331; 257/332; 257/333; 257/334

(58) Field of Classification Search ........ 257/328–334, 257/316–322
See application file for complete search history.

(56) References Cited

U.S. PATENT DOCUMENTS 5,468,663 A * 11/1995 Bertin et al. ................ 438/259
6,587,396 B1 * 7/2003 Jang ............................ 438/259
6,734,066 B2 * 5/2004 Lin et al. ..................... 438/259
6,913,974 B2 * 7/2005 Hung et al. .................. 438/257
7,001,809 B2 * 2/2006 Hsieh et al. ................. 438/259
2003/0186506 A1 * 10/2003 Huang ......................... 438/264
2004/0075134 A1 * 4/2004 Lin et al. ..................... 257/324
2004/0229422 A1 * 11/2004 Mori et al. .................. 438/221
2004/0238852 A1 * 12/2004 Lee et al. .................... 257/204
2005/0127428 A1 * 6/2005 Mokhlesi et al. ........... 257/315
2007/0023819 A1 * 2/2007 Sumino et al. .............. 257/315

FOREIGN PATENT DOCUMENTS

JP 2002-373948 12/2002
JP 2004-23093 1/2004

* cited by examiner

*Primary Examiner*—Ida M. Soward
(74) *Attorney, Agent, or Firm*—McGinn IP Law Group, PLLC (57) ABSTRACT

A nonvolatile semiconductor memory device includes a substrate, a central structure, a second gate insulating film, a floating gate, and a control gate. The substrate has a trench. The central structure is formed so as to be embedded in the trench and protruded from the substrate. The second gate insulating film is formed on the substrate so as to be contact with the central structure. The floating gate is formed on the second gate insulating film. The control gate is formed so as to cover the floating gate through a insulating film;. The central structure includes an assistant gate and a first gate insulating film which is formed such that the assistance gate is surrounded with the first gate insulating film. The floating gate is formed in a side wall shape on the side surface of the central structure.

18 Claims, 11 Drawing Sheets

NONVOLATILE SEMICONDUCTOR MEMORY DEVICE INCLUDING AN ASSISTANT GATE FORMED IN A TRENCH

BACKGROUND OF THE INVENTION

1. Field of the Invention

The present invention relates to a nonvolatile semiconductor memory device and a method for manufacturing the same.

2. Description of the Related Art

Japanese Laid Open Patent Application JP, 2004-23093A discloses a trench type flash memory. This flash memory includes: a substrate having a trench; a gate structure; a source region placed in the substrate around the bottom of the trench; and a drain region placed in the substrate around the top of the trench. A tunnel oxide layer, a floating gate, a gate dielectric layer and a control gate are placed in the gate structure, in the order starting from the outer side to the inner side in the trench. Also, the control gate is surrounded and coated by the tunnel oxide layer, the floating gate and the gate dielectric layer.

Also, a split gate type flash memory is known. According to this split gate type flash memory, not only a control gate but also an assistant gate (selection gate) needs to be turned on, in order to turn on a transistor. Thus, even if charges are excessively removed from the floating gate, an excessive removal problem in which a channel region is always conductive is prevented. Also, with a source side injection (SSI), the injection efficiency of hot electrons is improved as compared with a case of a stack gate type flash memory.

Figure 1:
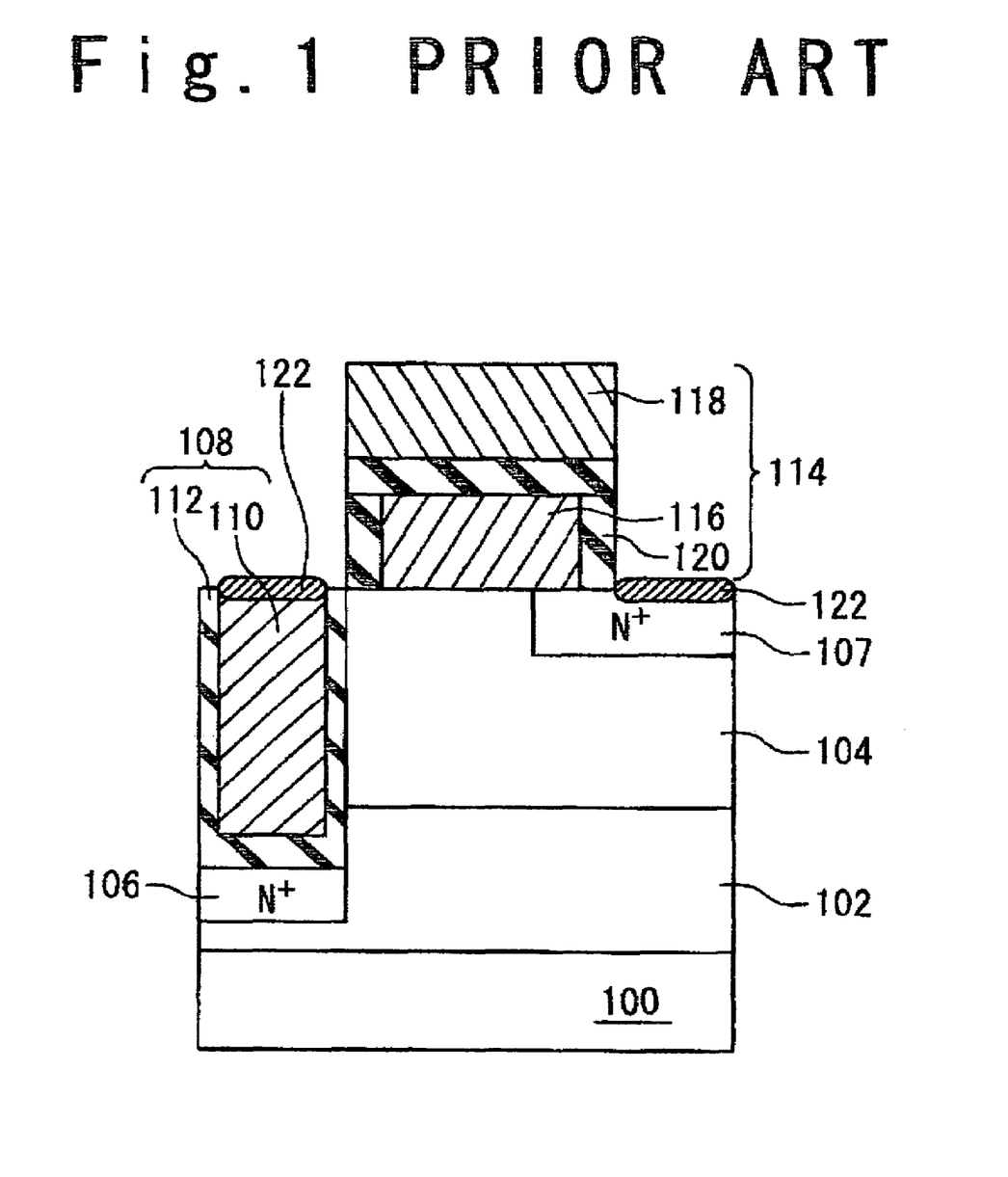
FIG. 1 is a sectional view showing a structure of this conventional trench split gate type flash memory cell.

Also, Japanese Laid Open Patent Application JP, 2002-373948A discloses a trench split gate type flash memory. FIG. 1 is a sectional view showing a structure of this conventional trench split gate type flash memory cell. This flash memory cell includes a P-type substrate 100, a deep N-well layer 102 and a P-well layer 104. The region doped at a high concentration inside the deep N-well layer forms a source region 106. An assistant gate region 108 on the source region 106 includes a polysilicon layer (assistant gate) 110 and an oxide layer 112. A gate 114 is located on the P-well layer 104 on one side of the assistant gate region 108. The gate 114 has a first polysilicon layer 116, a second polysilicon layer 118 and an insulating layer 120. A drain layer 107 is embedded in the P-well layer 104 on one side of the gate 114. Metal silicon compound layers 122 are formed on the surfaces of the drain region 107 and the polysilicon layer 110.

According to the technique disclosed in JP, 2002-373948A, the floating gate (first polysilicon layer 116) is formed by using a mask pattern. Thus, the size of the floating gate is the minimum manufacturing dimension (feature size) F or more. In this case, the minimum value of the size in a channel direction of a memory cell is "2×F", and the minimum value of the area of the memory cell is "(2×F)$^2$=4×F$^2$" in principle.

Recently, the capacity of a flash memory has been increased more and more. Thus, the further reduction in a memory cell size, the further improvement of an integration degree and the further drop in a bit cost are desired.

SUMMARY OF THE INVENTION

In order to achieve an aspect of the present invention, the present invention provides a nonvolatile semiconductor memory device including: a substrate which has a trench; a central structure which is formed so as to be embedded in said trench and protruded from said substrate; a second gate insulating film which is formed on said substrate so as to be contact with said central structure; a floating gate which is formed on said second gate insulating film; and a control gate which is formed so as to cover said floating gate through a insulating film; wherein said central structure includes: an assistant gate, and a first gate insulating film which is formed such that said assistance gate is surrounded with said first gate insulating film, said floating gate is formed in a side wall shape on the side surface of said central structure.

In this nonvolatile semiconductor memory device, the floating gate is formed in the side wall shape on the side of the central structure. By applying this structure to this device, the photography process can be removed in forming of the floating gate. Thus, it is possible to form the floating gate having the size of the minimum manufacturing dimension F (feature size) or less. Moreover, by applying this structure to this device, the floating gate can be formed by a self-alignment technology so as to be in contact with the outer surface of the first gate insulating film of the central structure. Therefore, the executions of the positioning and patterning process can be removed in forming of the floating gate. Thus, the distance between the assistant gate and the floating gate is prevented from being varied. That is, the variation in the writing property of the manufactured memory cell is suppressed.

According to the nonvolatile semiconductor memory device of the present invention and the method of manufacturing the same, the memory cell size is reduced, and the integration density is improved.

According to the nonvolatile semiconductor memory device of the present invention and the method of manufacturing the same, the cost is dropped.

According to the nonvolatile semiconductor memory device of the present invention and the method of manufacturing the same, the variation in the writing property is suppressed.

According to the nonvolatile semiconductor memory device of the present invention and the method of manufacturing the same, the reliability of the device is improved.

BRIEF DESCRIPTION OF THE DRAWINGS

The above and other objects, advantages and features of the present invention will be more apparent from the following description taken in conjunction with the accompanying drawings, in which:

FIGS. 4A to 4I are sectional views showing the processes of a method for manufacturing the nonvolatile semiconductor memory device 1 according to the present invention;

DESCRIPTION OF THE PREFERRED EMBODIMENTS

Embodiments of a nonvolatile semiconductor memory device and a method for manufacturing the same according to the present invention will be described below with reference to the attached drawings.

Figure 2:
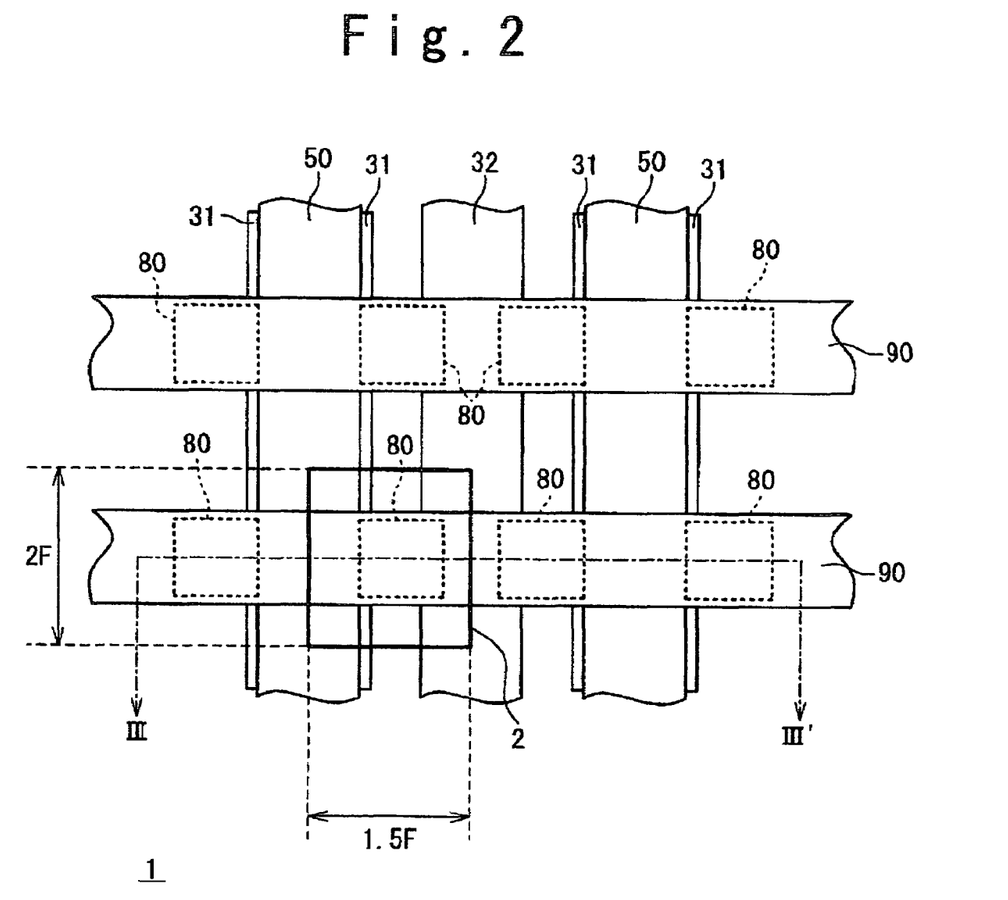
FIG. 2 is a plan view showing the structure of the nonvolatile semiconductor memory device according to the present invention.
Figure 3:
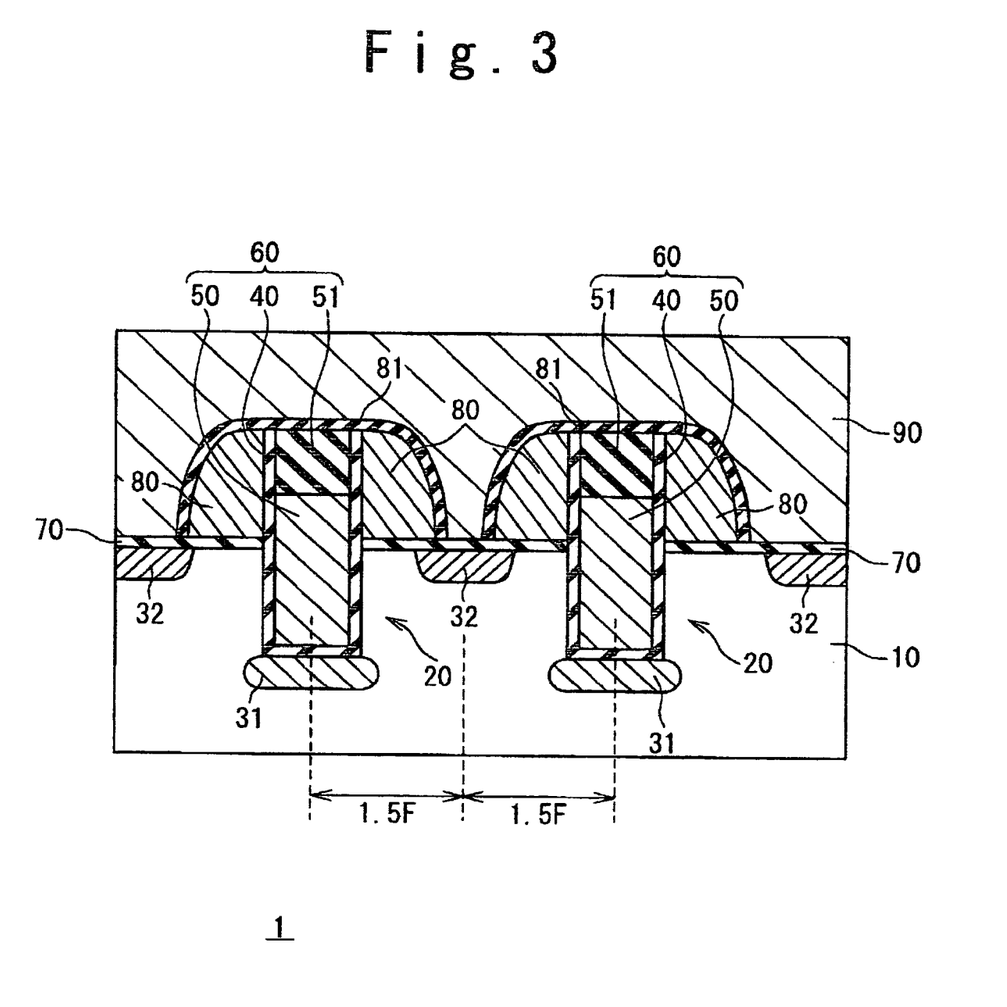
FIG. 3 is a sectional view showing the structure of the nonvolatile semiconductor memory device along the line III–III' in FIG. 2.

FIG. 2 is a plan view showing the structure of the nonvolatile semiconductor memory device according to the present invention. FIG. 3 is a sectional view showing the structure of the nonvolatile semiconductor memory device along the line III–III' in FIG. 2.

As shown in FIG. 3, in a nonvolatile semiconductor memory device 1 according to the present invention, a trench 20 is formed on a semiconductor substrate 10. A central structure 60 is formed in this trench 20. This central structure 60 is embedded in the trench 20 and protrudes from the semiconductor substrate 10.

The central structure 60 includes a first gate insulating film 40, an assistant gate 50 and an oxide film 51. The first gate insulating film 40 is formed on the outmost circumference of this central structure 60 and corresponds to the surface of the central structure 60. The assistant gate 50 is made of polysilicon and formed inside the central structure 60. Here, the assistant gate 50 is formed so as to protrude from the surface of the semiconductor substrate 10. The oxide film 51 is filled in the region except the assistant gate 50 in the central structure 60.

A source region 31 is formed in the semiconductor substrate 10 in the lower portion of the central structure 60. Also, a drain region 32 is formed in a predetermined region in the semiconductor substrate 10.

On the semiconductor substrate 10, a second gate insulating film 70 is formed so as to be in contact with the central structure 60. This second gate insulating film 70 plays the role as tunnel insulating film. A floating gate 80 made of polysilicon is formed on this second gate insulating film 70. This floating gate 80 overlaps with a part of the drain region 32. In short, the drain region 32 is formed below a part of the floating gate 80.

According to the nonvolatile semiconductor memory device 1 related to the present invention, the floating gate 80 is formed so as to be in contact with the outer surface of the central structure 60 as mentioned above. In short, this floating gate 80 is formed so as to have "side wall shape" in the region adjacent to the central structure 60. In this case, the floating gate 80 has a first surface in contact with the first gate insulating film 40 of the central structure 60, a second surface in contact with the second gate insulating film 70 (tunnel insulating film) and a third surface other than them.

Also, an insulating layer 81 is formed so as to cover the floating gate 80 and the central structure 60. In this case, the insulating layer 81 is in contact with the third surface of the floating gate 80. Also, this insulating layer 81 is, for example, an ONO (oxide-nitride-oxide) film. Then, on this insulating layer 81, a control gate 90 made of polysilicon is formed so as to cover the floating gate 80.

As shown in FIG. 2, the assistant gate 50 and the control gate 90 are formed so as to be orthogonal to each other. Also, the drain region 32 and the control gate 90 are formed so as to be orthogonal to each other. Moreover, the boundary of the floating gate 80 is in coincidence with the boundary of the assistant gate 50 (central structure 60).

The nonvolatile semiconductor memory device 1 having the foregoing structure is manufactured by, for example, the following processes. FIGS. 4A to 4I are sectional views showing the processes of a method for manufacturing the nonvolatile semiconductor memory device 1 according to the present invention. In FIGS. 4A to 4I, the same reference numbers are given to the configurations similar to the configurations shown in FIGS. 2, 3.

Figure 4A:
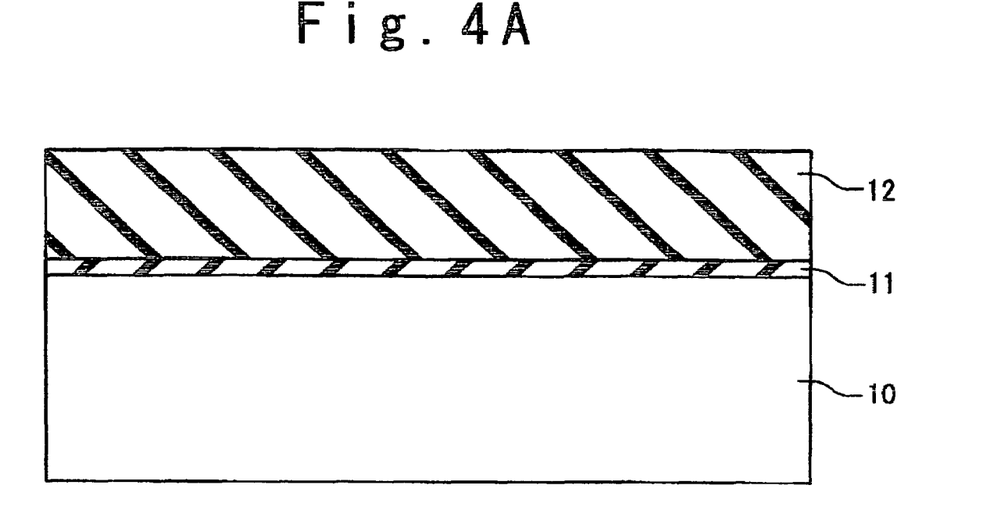

As shown in FIG. 4A, a dummy oxide film 11 is firstly formed on the semiconductor substrate 10. Moreover, a nitride film 12 is formed on the dummy oxide film 11. The thickness of this nitride film 12 is, for example, 0.2 µm. Those dummy oxide film 11 and nitride film 12 play the role as a mask layer.

Figure 4B:
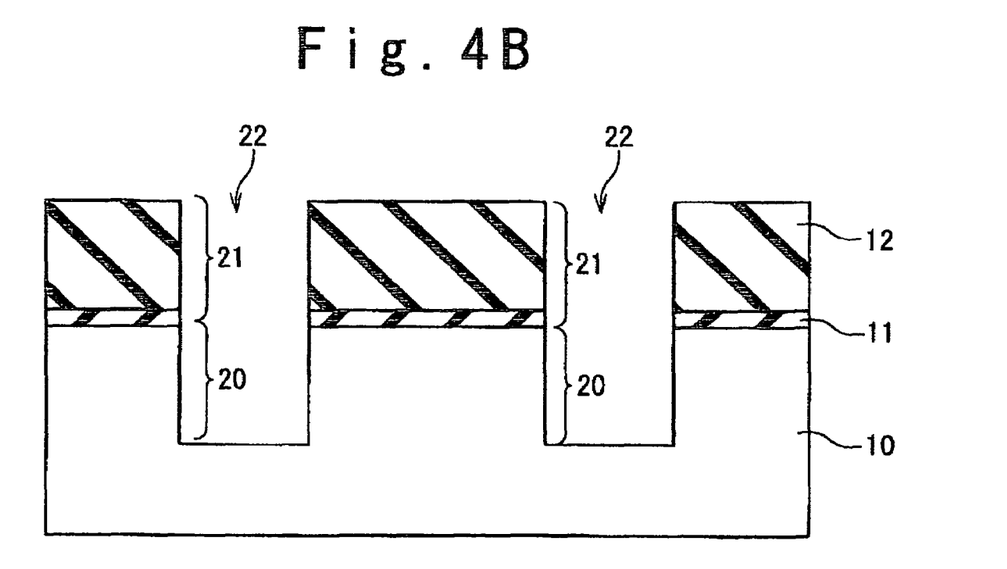

Next, as shown in FIG. 4B, a trench region 22 is formed by a trench-etching process. This trench region 22 penetrates the foregoing nitride film 12 and dummy oxide film 11 and leads to the inside of the semiconductor substrate 10. Hereafter, the trench region 22 inside the semiconductor substrate 10 is referred to as a lower trench region 20, and the trench region 22 inside to the dummy oxide film 11 and nitride film 12 is referred to as an upper trench region 21.

Figure 4C:
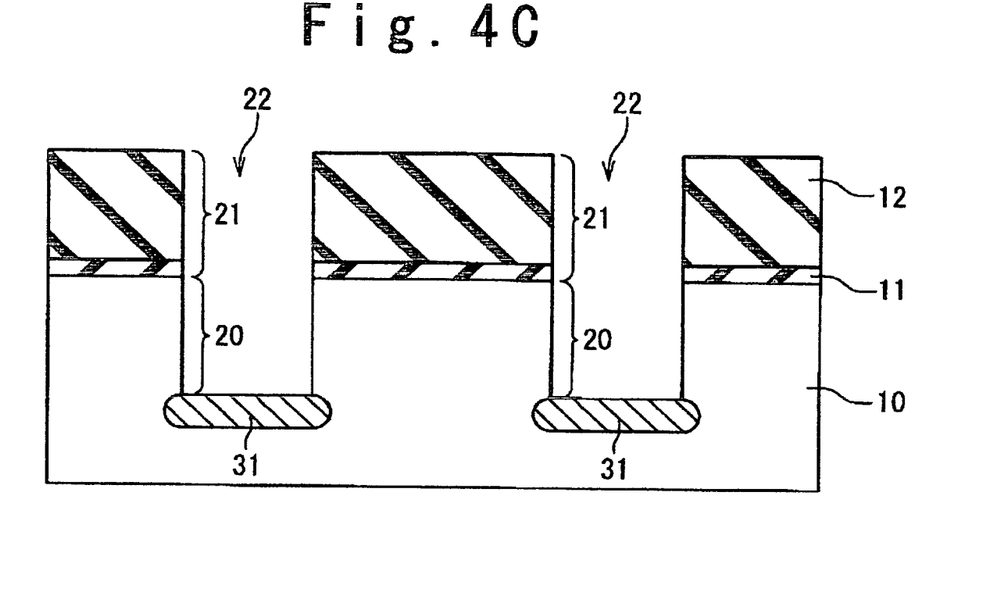

Next, as shown in FIG. 4C, dopant ions are implanted into the semiconductor substrate 10 in the bottom of the trench region 22, and the source region 31 is formed. As the dopant ions, for example, arsenic ions are used.

Figure 4D:
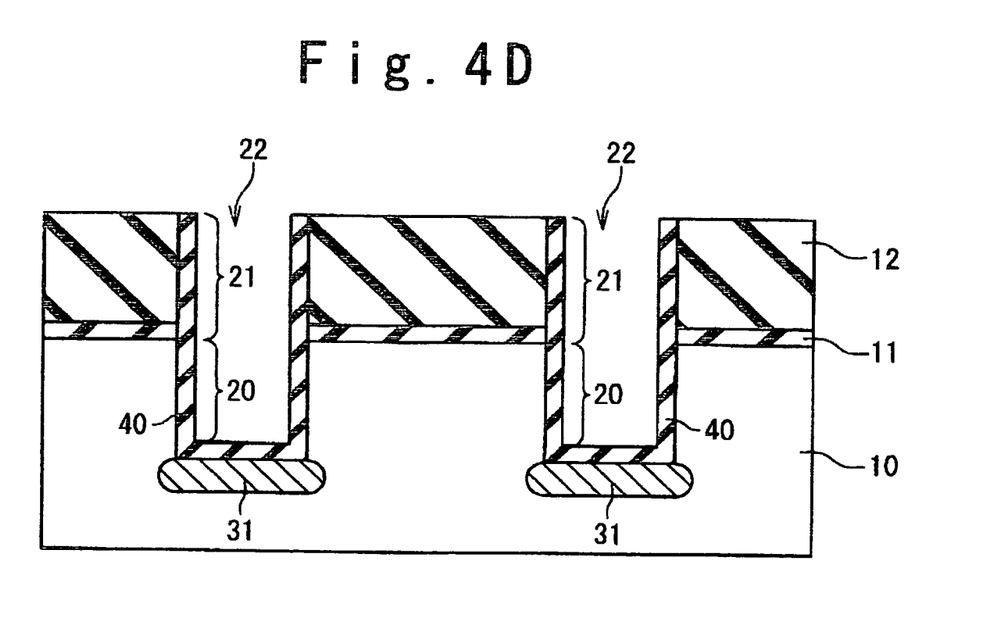

Next, as shown in FIG. 4D, a thermal oxidization method or the like is used to form the first gate insulating film 40 inside the trench region 22. This first gate insulating film 40 is formed on the surface (inner wall) inside the trench region 22 of the semiconductor substrate 10, the dummy oxide film 11 and the nitride film 12.

Figure 4E:
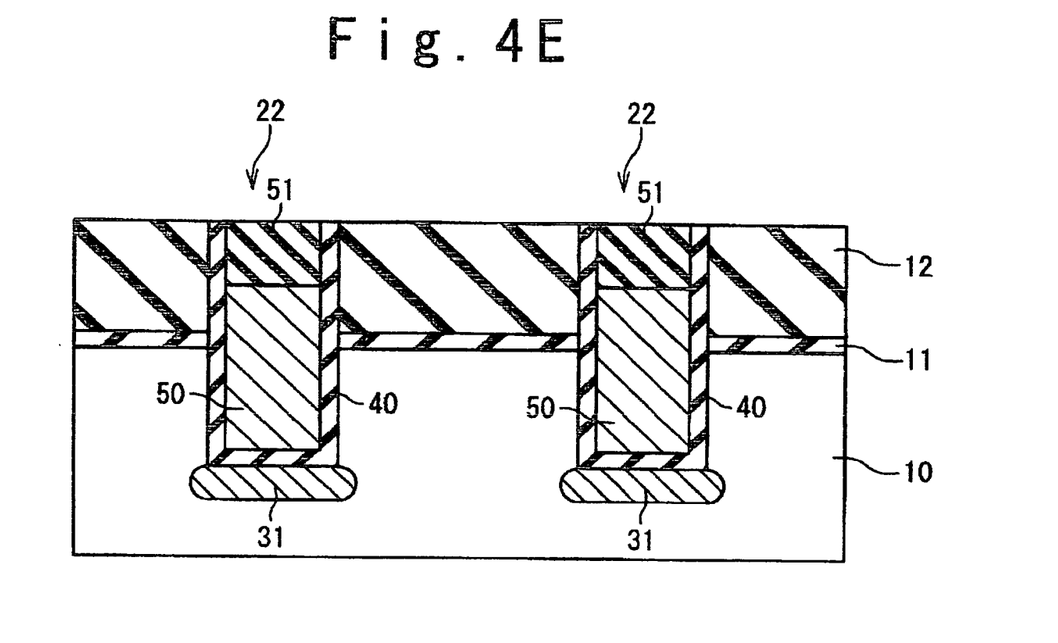

Next, a doped polysilicon film is deposited on the entire surface. Then, a CMP (Chemical Mechanical Polishing) process and an etch-back process are executed such that the polysilicon remains only inside the trench region 22. Consequently, the assistant gate 50 is formed so as to be surrounded with the first gate insulating film 40 in the trench region 22. Here, as shown in FIG. 4E, the assistant gate 50 is preferred to be formed so as to be perfectly embedded in the lower trench region 20 and protrude from the surface of the semiconductor substrate 10. In succession, after the oxide film layer is formed on the entire surface, the CMP process is executed. Thus, the region remaining in the trench region 22 (upper trench region 21) is filled with the oxide film 51. In this way, the structure shown in FIG. 4E is obtained.

Figure 4F:
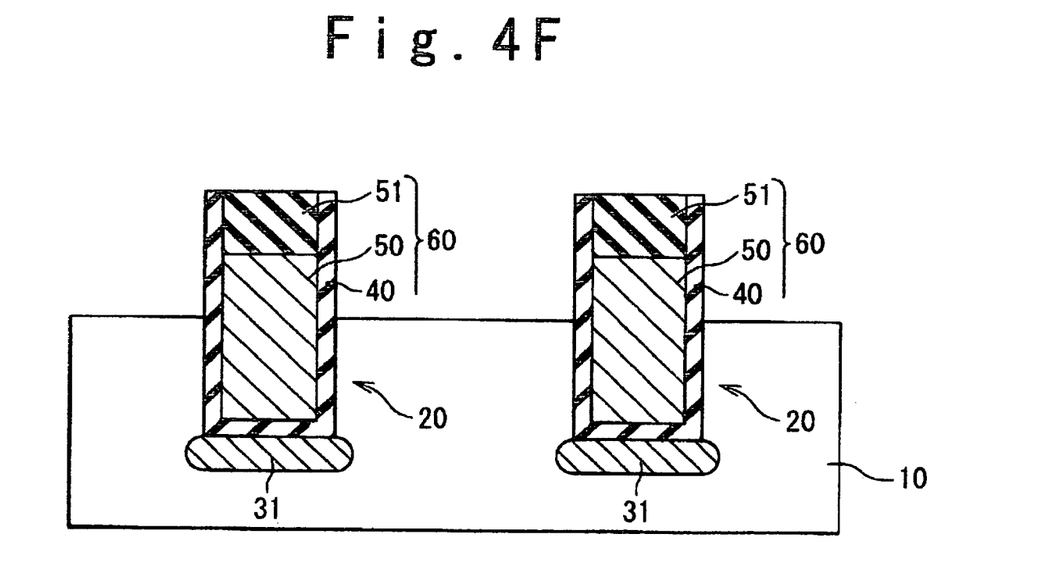

Next, as shown in FIG. 4F, with wet etching process, the nitride film 12 and the dummy oxide film 11 are removed, thereby exposing the surface of the semiconductor substrate 10. In this way, the central structure 60 composed of the first gate insulating film 40, the assistant gate 50 and the oxide film 51 is formed. As shown in FIG. 4F, this central structure 60 is embedded in the lower trench region 20 and protrudes from the surface of the semiconductor substrate 10. Also, the first gate insulating film 40 is the outer wall of the central structure 60.

Figure 4G:
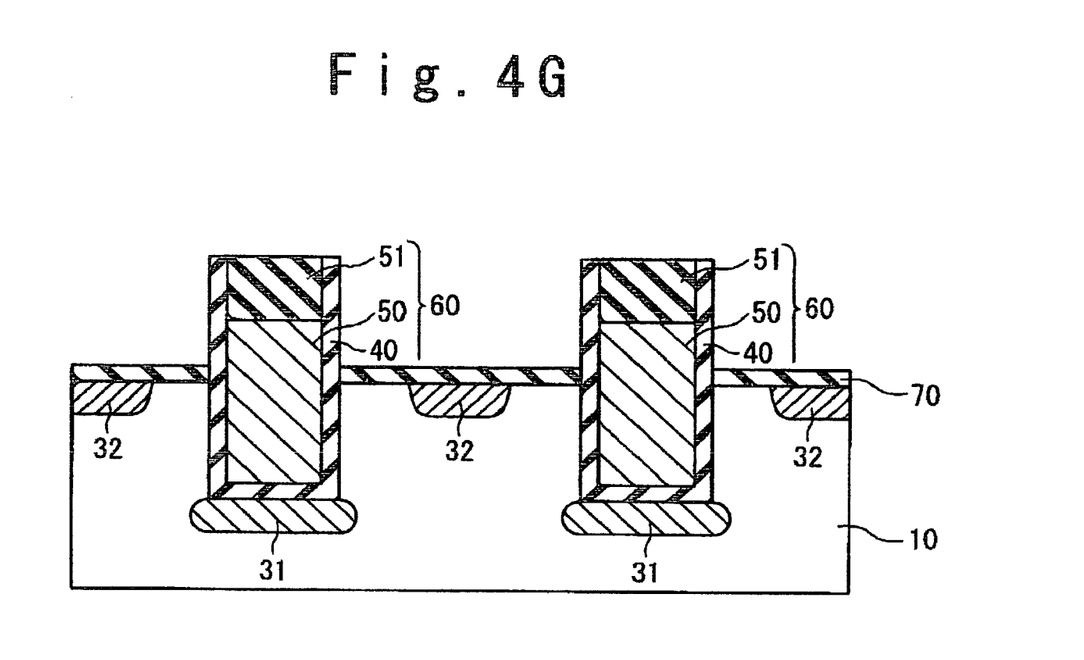

Next, as shown in FIG. 4G, the second gate insulating film 70 is formed on the surface of the exposed semiconductor substrate 10. This second gate insulating film 70 is in contact with the first gate insulating film 40 of the central structure 60. Also, since this second gate insulating film 70 is used as the tunnel oxide film, it is formed such that its film thickness is, for example, 10 nm. Moreover, the dopant ions are implanted into a predetermined region of the semiconductor substrate 10, and the drain region 32 is formed. As the dopant ions, for example, the arsenic ions are used.

Figure 4H:
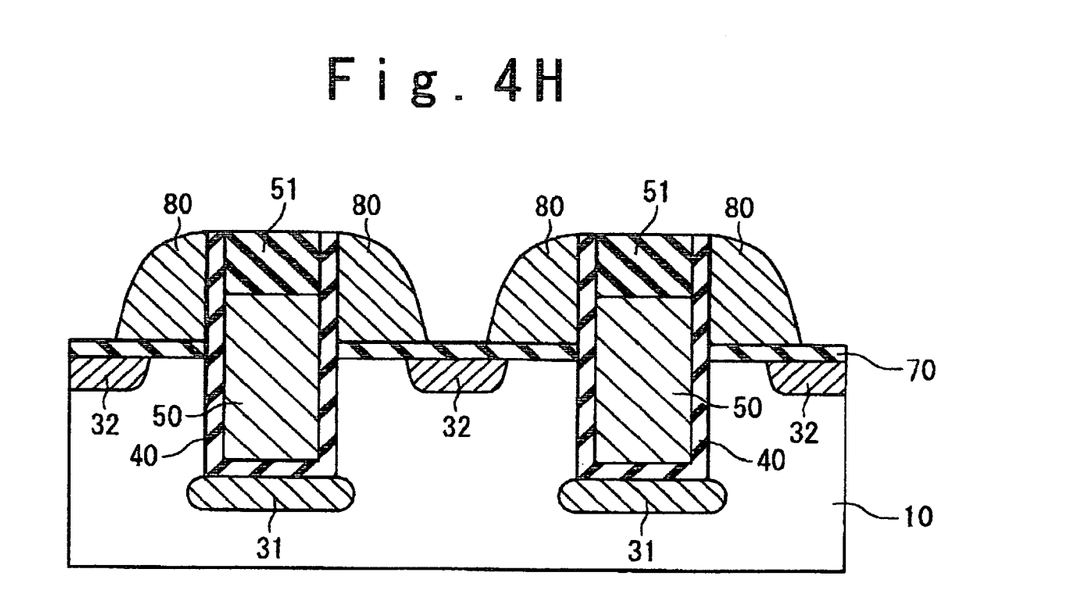

Next, for example, a polysilicon film having a thickness of 0.2 μm is formed on this second gate insulating film 70. After that, the etch-back process is executed. Consequently, as shown in FIG. 4H, the floating gate 80 with "side wall shape" is formed on the side of the central structure 60. Here, a photography process is not used. Thus, according to the present invention, it is possible to form the floating gate 80 having the size of the minimum manufacturing dimension (feature size) F or less. Moreover, according to the present invention, the floating gate 80 is formed by a self-alignment technology so as to be in contact with the outer surface of the first gate insulating film 40 of the central structure 60. Hence, the variation in the distance between the assistant gate 50 and the floating gate 80 is prevented.

Next, as shown in FIG. 4I, the insulating layer 81 composed of the ONO (oxide-nitride-oxide) film is formed on the floating gate 80 and the central structure 60. Then, the control gate 90 made of polysilicon is formed on this insulating layer 81. Here, this control gate 90 is formed so as to cover the floating gate 80.

The operation of the above-mentioned nonvolatile semiconductor memory device 1 will be described below.

Figure 5:
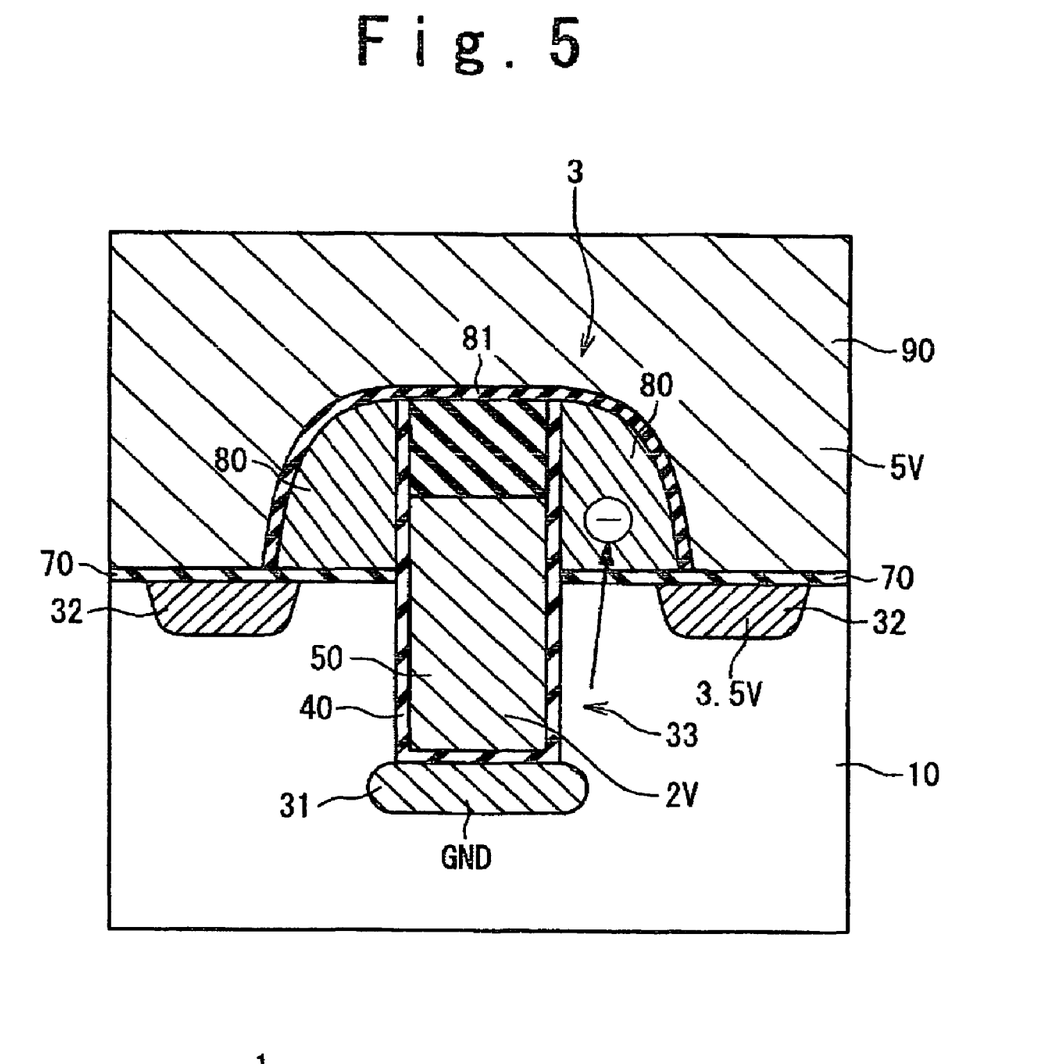
FIG. 5 is a sectional view showing an example of writing operation.

FIG. 5 is a sectional view showing an example of writing operation to a certain selected memory cell 3. As shown in FIG. 5, for example, 0 V is applied to the source region 31, 3.5 V is applied to the drain region 32, 5 V is applied to the control gate 90, and 2 V is applied to the assistant gate 50. Consequently, a channel region 33 is formed in the vicinity of the side wall of the first gate insulating film 40. Then, the hot electrons that can exceed an energy barrier are injected into the floating gate 80. In this case, a threshold voltage of the selection memory cell 3 is increased. Here, the injection of the hot electrons is carried out from the side of the source region 31 (source side injection). Thus, the excellent injection efficiency of the hot electrons is obtained. Also, the injection direction of the hot electrons is in coincidence with the acceleration direction of the electrons in the channel region 33. Hence, its injection efficiency is further improved.

Also, in the present invention, the vicinity of the side wall of the first gate insulating film 40 serves as the channel region 33. Thus, preferably, the assistant gate 50 is formed so as to protrude from the surface of the semiconductor substrate 10 inside the central structure 60. Hence, the mobility of the electrons in the channel region 33 is increased, and the resistance is dropped.

Figure 6:
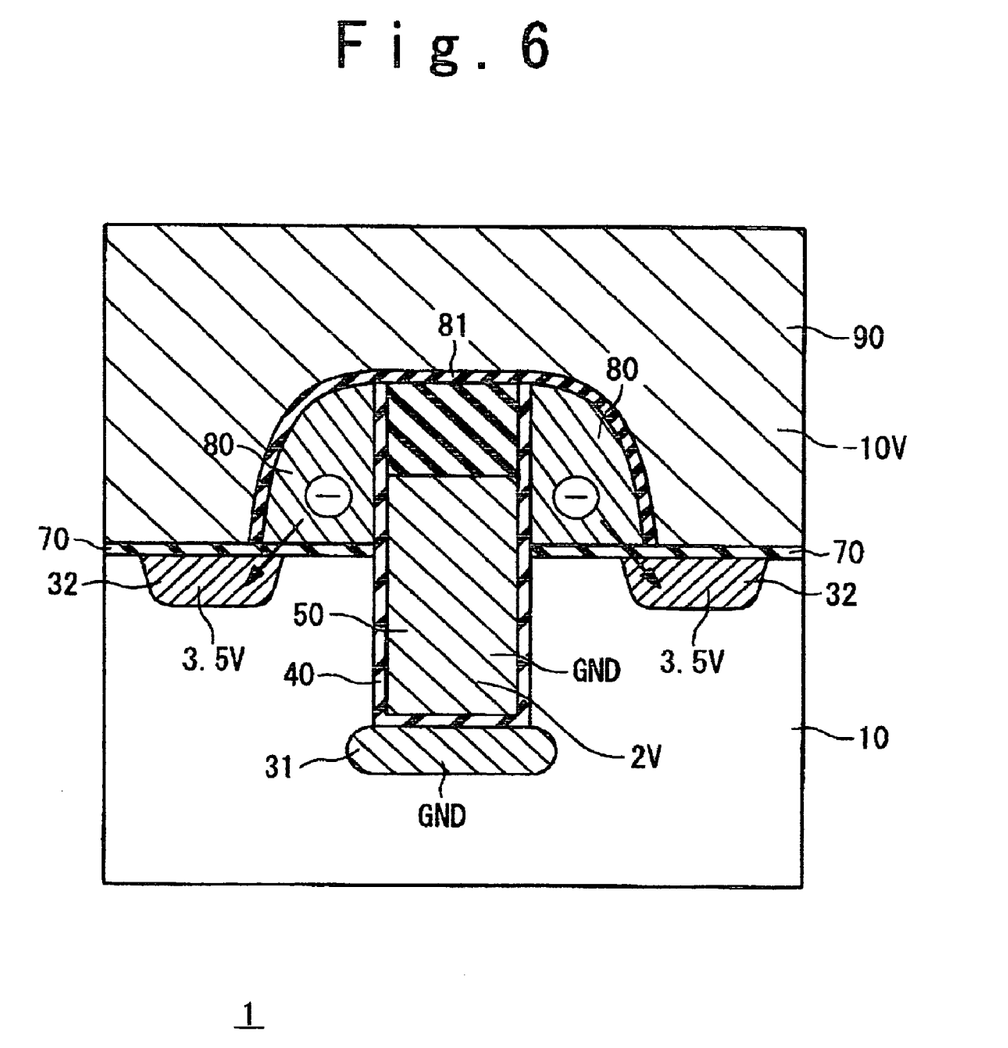
FIG. 6 is a sectional view showing an example of erasing operation.

FIG. 6 is a sectional view showing an example of erasing operation. At a time of the erasing operation, a negative high voltage is applied to the control gate 90, and a positive voltage is applied to the drain region 32. For example, −10 V is applied to the control gate 90, 3.5 V is applied to the drain region 32, and 0 V is applied to the assistant gate 50 and the source region 31. Consequently, an FN (Fowler Nordheim) current flows between the floating gate 80 and the drain region 32. That is, the electrons charged in the floating gate 80 are discharged through the second gate insulating film 70 (tunnel insulating film) to the drain region 32. Also, instead of the drain region 32, the positive voltage may be applied to the semiconductor substrate 10. In this case, the FN current causes the electrons charged in the floating gate 80 to be discharged to the semiconductor substrate 10.

Figure 7:
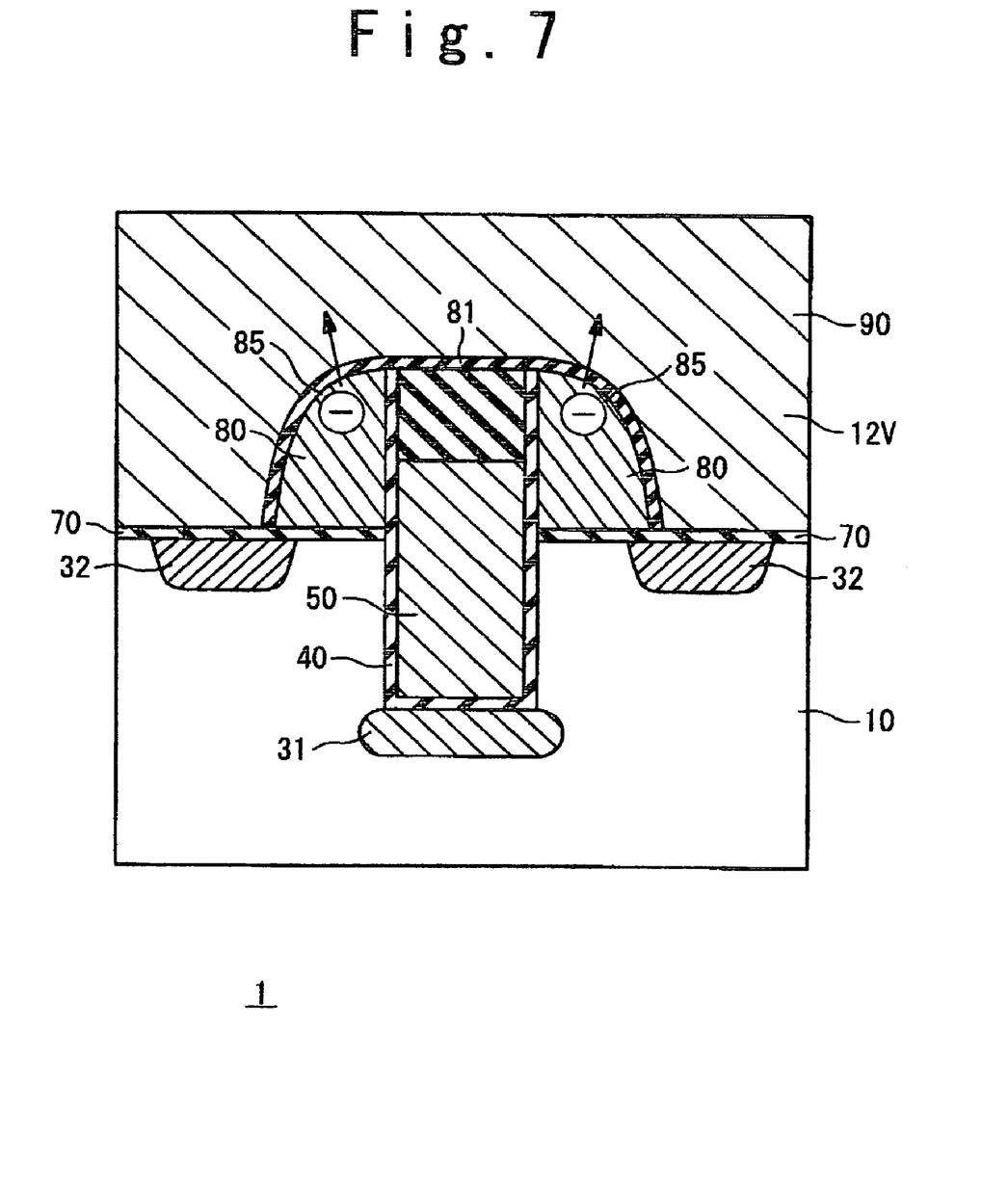
FIG. 7 is a sectional view showing another example of erasing operation.

FIG. 7 is a sectional view showing another example of erasing operation. At the time of the erasing operation, the positive high voltage may be applied to the control gate 90. For example, +12 V is applied to the control gate 90. In this case, with the FN current, the electrons charged in the floating gate 80 are discharged through the insulating layer 81 to the control gate 90. In this way, the electrons are not passed through the second gate insulating film 70, which suppresses the deterioration in the second gate insulating film (tunnel insulating film) 70. Thus, the reliability of the nonvolatile semiconductor memory device 1 is improved.

Moreover, the floating gate 80 according to the present invention has the side wall shape, and its head top 85 has the structure that easily induces the discharge of the electrons caused by the FN current. Thus, the film thickness of the insulating layer 81 between the floating gate 80 and the control gate 90 can be made thicker. Consequently, the reliability of the nonvolatile semiconductor memory device 1 is improved.

As mentioned above, a method for manufacturing a nonvolatile semiconductor memory device according to the present invention, includes: (a) forming a mask layer on a substrate; (b) forming a trench region extended to the inside of the substrate through the mask layer; (c) forming a first gate insulating film on the mask layer and a surface of the substrate in the trench region; (d) forming an assistant gate in the trench region such that the assistant gate is surrounded with the first gate insulating film; (e) removing the mask layer; (f) forming a second gate insulating film on the substrate such that the second gate insulating film is contact with the first gate insulating film; (g) forming a floating gate on the second gate insulating film such that the floating gate is contact with the outside surface of the first gate insulating film by a self-alignment technology; and (h) forming a control gate on the floating gate though a insulating film.

In the above method for manufacturing a nonvolatile semiconductor memory device according to the present invention, in the step (d), the assistant gate is formed so as to be protruded from the substrate.

The effects of the nonvolatile semiconductor memory device 1 according to the present invention will be described below.

According to the present invention, the floating gate 80 is formed in the side wall shape on the side of the central structure 60 protruding from the surface of the semiconductor substrate 10. Here, the photography process is not used. Thus, it is possible to form the floating gate 80 having the size of the minimum manufacturing dimension F (feature size) or less. At this time, as shown in FIGS. 2, 3, for example, it is possible to form a memory cell 2 having a channel direction size of "1.5×F". Then, as shown in FIG. 2, in principle, it is possible to form the memory cell 2 having an area of "3×F$^2$". In this way, according to the present invention, the memory cell size is reduced, thereby increasing the integration degree of the device. Thus, the cost is decreased.

Moreover, according to the present invention, the floating gate 80 is formed by a self-alignment technology so as to be in contact with the outer surface of the first gate insulating film 40 of the central structure 60. Therefore, the executions of the positioning and patterning are not required, in order to form the floating gate. Thus, the distance between the assistant gate 50 and the floating gate 80 is prevented from being varied. That is, according to the present invention, the variation in the writing property of the manufactured memory cell is suppressed.

Also, preferably, the assistant gate 50 of the central structure 60 is formed so as to protrude from the surface of the semiconductor substrate 10. Consequently, the resistance in the channel region 33 is dropped. Also, at the time of the erasing operation, preferably, the positive voltage is applied to the control gate 90. Consequently, the reliability of the nonvolatile semiconductor memory device 1 is improved.

It is apparent that the present invention is not limited to the above embodiment, that may be modified and changed without departing form the scope and spirit of the invention.

What is claimed is:

1. A nonvolatile semiconductor memory device comprising:
    a substrate which has a trench;
    a central structure which is embedded in said trench and protrudes from said trench;
    a second gate insulating film which is formed on said substrate and in contact with said central structure;
    a floating gate which is formed on said second gate insulating film; and
    a control gate which covers said floating gate through an insulating film,
    wherein said central structure includes:
        an assistant gate; and
        a first gate insulating film which is formed such that said assistant gate is surrounded with said first gate insulating film, and
    wherein said floating gate is formed in a side wall shape on an outer side surface of said first gate insulating film.

2. The nonvolatile semiconductor memory device according to claim 1, wherein positive voltage is applied to said control gate when an erasing operation is executed.

3. The nonvolatile semiconductor memory device according to claim 1, wherein said central structure comprises a protruding portion which protrudes from said trench, said floating gate being formed on a side of said protruding portion of said central structure.

4. The nonvolatile semiconductor memory device according to claim 1, wherein said floating gate comprises a feature size that is no greater than a minimum manufacturing dimension, F for said memory device.

5. The nonvolatile semiconductor memory device according to claim 1, further comprising:
    a source region which is formed under said central structure in said substrate; and
    a drain region which is formed under a part of said floating gate in said substrate.

6. The nonvolatile semiconductor memory device according to claim 5, wherein said floating gate is formed on each of both sides of said central structure.

7. The nonvolatile semiconductor memory device according to claim 5, wherein positive voltage is applied to said control gate when an erasing operation is executed.

8. The nonvolatile semiconductor memory device according to claim 1, wherein said central structure further includes an oxide film formed on said assistant gate, said first gate insulating film being formed on a sidewall of said oxide film.

9. The nonvolatile semiconductor memory device according to claim 8, wherein said insulating film is formed on said central structure and said floating gate.

10. The nonvolatile semiconductor memory device according to claim 9, wherein said insulating layer is formed between said floating gate and said control gate.

11. The nonvolatile semiconductor memory device according to claim 1, wherein said assistant gate is formed so as to be protruded from said substrate in said central structure.

12. The nonvolatile semiconductor memory device according to claim 2, wherein positive voltage is applied to said control gate when an erasing operation is executed.

13. The nonvolatile semiconductor memory device according to claim 11, wherein a height of said assistant gate from said surface of said substrate is lower than that of said floating gate from said surface of said substrate.

14. The nonvolatile semiconductor memory device according to claim 13, wherein a film thickness of said first gate insulating film is substantially constant on a side surface of said assistant gate.

15. The nonvolatile semiconductor memory device according to claim 2, further comprising:
    a source region which is formed under said central structure in said substrate; and
    a drain region which is formed under a part of said floating gate in said substrate.

16. The nonvolatile semiconductor memory device according to claim 15, wherein positive voltage is applied to said control gate when an erasing operation is executed.

17. A semiconductor memory device comprising:
    a substrate which has a trench;
    an assistant gate which is formed in said trench and protrudes from said trench;
    a first gate insulating film formed in said trench and surrounding said assistant gate;
    a second gate insulating film which is formed on said substrate and in contact with said first gate insulating film;
    a floating gate which is formed on said second gate insulating film and on an outer side surface of the first gate insulating film; and
    a control gate which covers said floating gate.

18. A semiconductor memory device comprising:
    a semiconductor layer comprising a trench;
    an assistant gate formed in said trench and including a portion from said trench;
    a floating gate formed on said semiconductor layer;
    a first gate insulating film formed between a top surface of said semiconductor layer and a bottom surface of said floating gate and between a side surface of the protruded portion of said assistant gate and said floating gate;
    a second gate insulating film formed on another surface of said floating gate; and
    a control gate covering said second gate insulating film, a distance between a bottom surface of said control gate and a top surface of said semiconductor layer being less than a distance between said bottom surface of said control gate and a top surface of said assistant gate.

* * * * *